(12) United States Patent
Cho et al.

(10) Patent No.: US 9,825,047 B2
(45) Date of Patent: Nov. 21, 2017

(54) 3-D STRUCTURED NON-VOLATILE MEMORY DEVICE AND METHOD OF MANUFACTURING THE SAME

(75) Inventors: Sung Yoon Cho, Gyeonggi-do (KR); Hae Jung Lee, Seoul (KR); Byung Soo Park, Gyeonggi-do (KR); Eun Mi Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 954 days.

(21) Appl. No.: 13/587,612

(22) Filed: Aug. 16, 2012

(65) Prior Publication Data
US 2013/0043509 A1 Feb. 21, 2013

(30) Foreign Application Priority Data

Aug. 16, 2011 (KR) .................. 10-2011-0081285

(51) Int. Cl.
| | |
|---|---|
| H01L 23/52 | (2006.01) |
| H01L 27/11526 | (2017.01) |
| H01L 27/11548 | (2017.01) |
| H01L 27/11556 | (2017.01) |
| H01L 27/11573 | (2017.01) |
| H01L 27/11575 | (2017.01) |
| H01L 27/11582 | (2017.01) |

(52) U.S. Cl.
CPC .. *H01L 27/11526* (2013.01); *H01L 27/11548* (2013.01); *H01L 27/11556* (2013.01); *H01L 27/11573* (2013.01); *H01L 27/11575* (2013.01); *H01L 27/11582* (2013.01)

(58) Field of Classification Search
USPC ....... 257/202–211, E23.02, E21.59; 438/128
See application file for complete search history.

(56) References Cited

U.S. PATENT DOCUMENTS

| | | | | |
|---|---|---|---|---|
| 2009/0310415 | A1* | 12/2009 | Jin et al. .................. | 365/185.17 |
| 2010/0213526 | A1* | 8/2010 | Wada et al. ................. | 257/314 |
| 2011/0256672 | A1* | 10/2011 | Wada et al. ................. | 438/128 |
| 2012/0319173 | A1* | 12/2012 | Ko et al. ....................... | 257/211 |

* cited by examiner

*Primary Examiner* — Robert Bachner
(74) *Attorney, Agent, or Firm* — IP & T Group LLP

(57) ABSTRACT

A non-volatile memory device according to an aspect of the present disclosure includes a substrate, a plurality of word lines stacked over the substrate and having a stepwise pattern, wherein the plurality of word lines each have a pad region, and a plurality of contact plugs coupled to the respective pad regions of the word lines, wherein a width of a pad region of a first one of the plurality of word lines is greater than a width of a pad region of a second word line lower than the first word line.

10 Claims, 9 Drawing Sheets

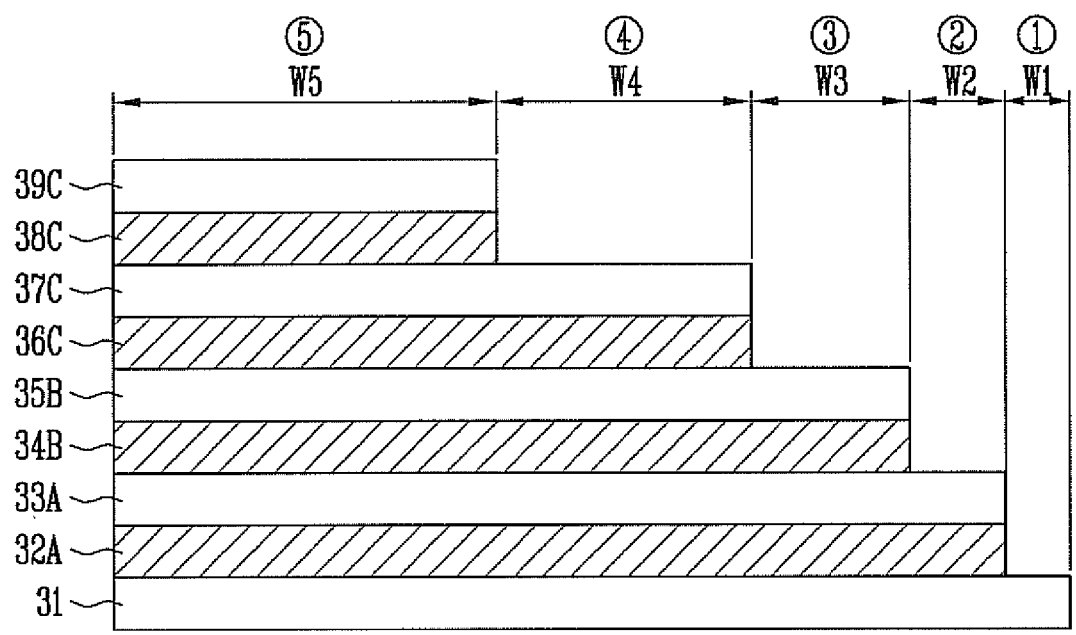

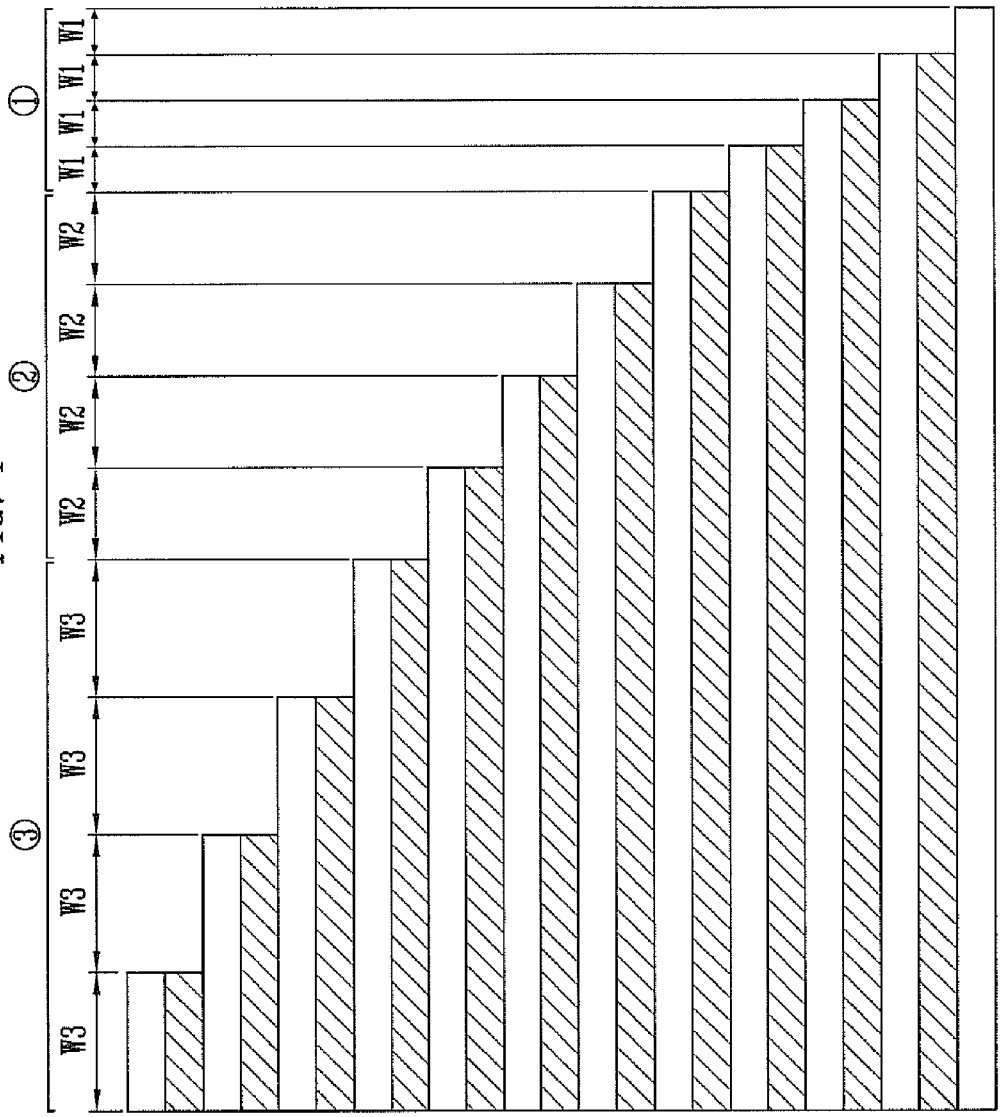

United States Patent US 9,825,047 B2

3-D STRUCTURED NON-VOLATILE MEMORY DEVICE AND METHOD OF MANUFACTURING THE SAME

CROSS-REFERENCE TO RELATED APPLICATION

Priority to Korean patent application number 10-2011-0081285 filed on Aug. 16, 2011, the entire disclosure of which is incorporated by reference herein, is claimed.

BACKGROUND

Exemplary embodiments relate to a semiconductor device and a method of manufacturing the same and, more particularly, to a non-volatile memory device having a three dimensional (3-D) structure and a method of manufacturing the same.

A non-volatile memory device retains its data even after a power supply is cut off. As the degree of integration of two dimensional (2-D) memory devices fabricated over a silicon substrate as a single layer in reaching physical limits, a 3-D non-volatile memory device in which memory cells are vertically stacked from a silicon substrate is being developed.

A conventional method of manufacturing a 3-D non-volatile memory device and features thereof are described below with reference to the accompanying drawings.

FIGS. 1A to 1E are cross-sectional views illustrating a conventional process of manufacturing a non-volatile memory device having a 3-D structure. For illustration purposes, while a memory cell region is not depicted, pad regions are shown.

As shown in FIG. 1A, a plurality of interlayer dielectric layers 11, 13, 15, 17, and 19 and a plurality of conductive layers 12, 14, 16, and 18 are alternately formed over a substrate (not shown) which has cell region and pad region.

A process for forming channels extending from the substrate and a plurality of memory cells stacked along the channels is performed, while a detailed description thereof is omitted as being well-known.

Subsequently, a photoresist pattern 20 for forming pad regions is formed over the plurality of interlayer dielectric layers 11, 13, 15, 17, and 19 and the plurality of conductive layers 12, 14, 16, and 18.

The photoresist pattern 20 is used as an etch barrier in an etch process of forming pad regions to be coupled to contact plugs for a plurality of word lines. The width W of the photoresist pattern 20 first formed is set so as to expose the pad region of the lowest conductive layer 12.

Subsequently, the highest interlayer dielectric layer 19 and the highest conductive layer 18 are etched using the photoresist pattern 20 as an etch barrier.

As shown in FIG. 1B, the photoresist pattern 20 corresponding to the width of the pad region is removed by etching. Subsequently, the highest interlayer dielectric layer 19 and the highest conductive layer 18 are etched using the remaining photoresist pattern 20A as an etch barrier. In the process of etching the highest interlayer dielectric layer 19 and the highest conductive layer 18, a step between layers as formed by etched photoresist pattern 20B is also transferred to the etched layers below. Further, the interlayer dielectric layer 17 and the conductive layer 16 under the highest interlayer dielectric layer 19 and the highest conductive layer 18 are etched.

In FIG. 1B, the etched interlayer dielectric layers are assigned reference characters 19A and 17A, and the etched conductive layers are assigned reference characters 18A and 16A.

As shown in FIG. 1C, the photoresist pattern 20A is etched to be partially removed by a length equal to the width of the pad region. Subsequently, the interlayer dielectric layers 19A, 17A, and 15, exposed by the shortened photoresist pattern 20B are etched. Further, the conductive layers 18A, 16A, and 14 under the interlayer dielectric layers 19A, 17A, and 15 are etched.

In FIG. 1C, the etched interlayer dielectric layers are assigned reference characters 19B, 17B, and 15A, and the etched conductive layers are assigned reference characters 18B, 16B, and 14A.

As shown in FIG. 1D, the photoresist pattern 20B is etched to be partially removed by a length equal to the width of the pad region. Subsequently, the interlayer dielectric layers 19B, 17B, 15A, and 13, exposed by the shortened photoresist pattern 20C, and the conductive layers 18B, 16B, 14A, and 12 under the interlayer dielectric layer 19B, 17B, 15A, and 13 are etched.

In FIG. 1D, the etched interlayer dielectric layers are assigned reference characters 19C, 17C, 15B, and 13A, and the etched conductive layers are assigned reference characters 18C, 16C, 14B, and 12A.

Accordingly, the plurality of interlayer dielectric layers 19C, 17C, 15B, and 13A and the plurality of conductive layers 18C, 16C, 14B, and 12A form a stepwise pattern so that the surface of each of the plurality of conductive layers is exposed, where the exposed regions of the conductive layers form pad regions for the plurality of conductive layers 18C, 16C, 14B, and 12A.

As shown in FIG. 1E, an insulating layer (not shown) is formed on the entire structure of the resulting structure in which the pad regions are formed as described above. Subsequently, contact holes through which the respective pad regions of the plurality of conductive layers 18C, 16C, 14B, and 12A are exposed are formed.

A conductive layer is buried in the contact holes to form a plurality of contact plugs 21 coupled to the respective conductive layers 18C, 16C, 14B, and 12A.

The above-described conventional process, however, has a feature where neighboring word lines are bridged or circuits are disconnected when the pad region and the contact plug are misaligned (refer to I in FIG. 1E). Such a feature is described in detail below.

In the conventional art, the conductive layers 18C, 16C, 14B, 12A are made to have the pad regions having the same width by repeatedly performing an etch process while shortening the photoresist pattern by a same width each time. Here, the shortening of the photoresist pattern by a uniform length may be difficult to perform. Furthermore, if an error is generated, the errors are accumulated in the process of repeatedly performing the etch process. Accordingly, an error in the position and width of the pad region is increased for the conductive layer placed higher, where a probability that the contact plugs are misaligned is increased for the conductive layers that are located at higher positions.

To address such features, a method of securing a misalignment margin by generally increasing the width of the pad region has been used. In increasing the width of the pad region, the overall cell area is increased. Here, the thickness of the photoresist pattern is also decreased in the process of shortening the photoresist pattern. Thus, with an increase in the width of the pad region, a reduction in the thickness of the photoresist pattern is also increased. Consequently, the highest word line may be damaged when the photoresist pattern is fully removed in the process of repeatedly performing the etch process.

BRIEF SUMMARY

Exemplary embodiments relate to a 3-D non-volatile memory device and a method of manufacturing the same which are suitable for improving alignment margin between a pad region and a contact plug.

A non-volatile memory device according to an aspect of the present disclosure includes a substrate, a plurality of word lines stacked over the substrate and having a stepwise pattern, wherein the plurality of word lines each have a pad region, and a plurality of contact plugs coupled to the respective pad regions of the word lines, wherein a width of a pad region of a first one of the plurality of word lines is greater than a width of a pad region of a second word line lower than the first word line.

A method of manufacturing a non-volatile memory device according to another aspect of the present disclosure includes alternately stacking a plurality of interlayer dielectric layers and a plurality of conductive layers over a substrate; performing a first etching for one of the plurality of interlayer dielectric layers and a conductive layer under the interlayer dielectric layer by using the mask pattern; and decreasing a width of the mask pattern and performing a second etching for another one of the plurality of interlayer dielectric layers by using the shortened mask pattern and one of the plurality of conductive layers under the interlayer dielectric layer subject to the second etching; and repeating the decrease of the width of the mask pattern and the second etching, wherein the width of the mask pattern is decreased at each repetition, the repeating of the decrease of the width of the mask pattern and the second etching forms a stepwise pattern, and an upper step of the stepwise pattern has a step width greater than another step of the stepwise pattern.

BRIEF DESCRIPTION OF THE DRAWINGS

FIG. 3 is a diagram showing pad regions according to a second embodiment of this disclosure;

FIG. 4 is a diagram showing pad regions according to a third embodiment of this disclosure;

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

FIGS. 2A to 2E are cross-sectional views illustrating a process of manufacturing a non-volatile memory device having a 3-D structure according to a first embodiment of this disclosure. For purposes of illustration, while a memory cell region is not depicted, pad regions are shown.

Figure 1A:
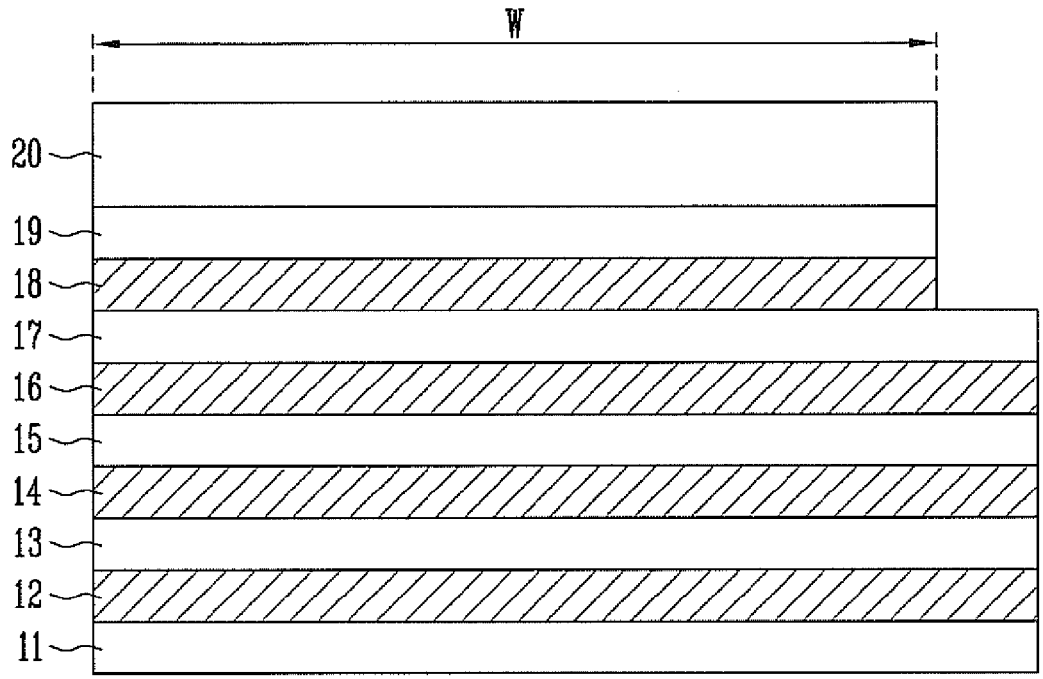
FIGS. 1A to 1E are cross-sectional views illustrating a conventional process of manufacturing a non-volatile memory device having a 3-D structure.
Figure 1B:
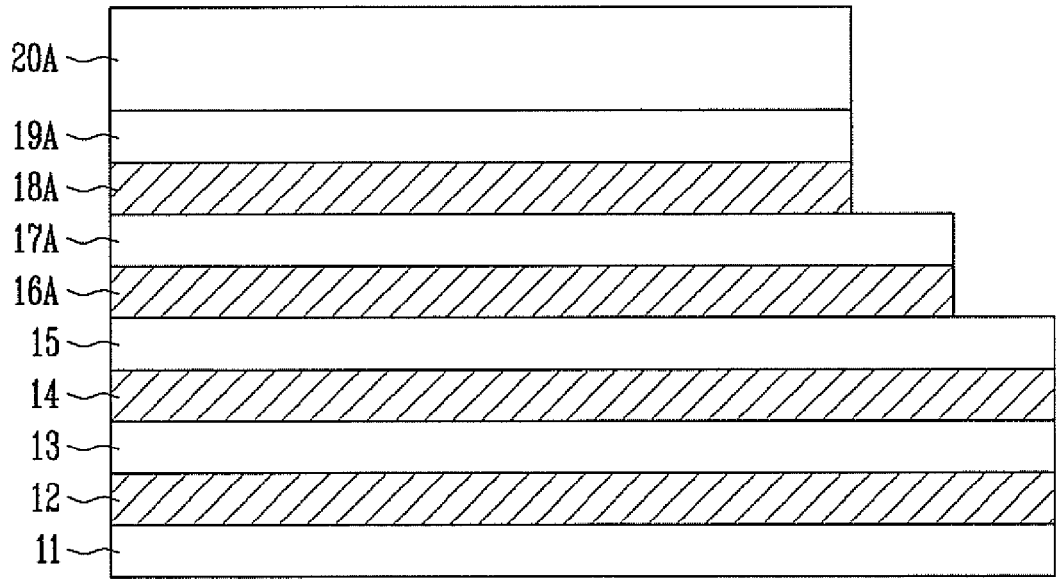
Figure 1C:
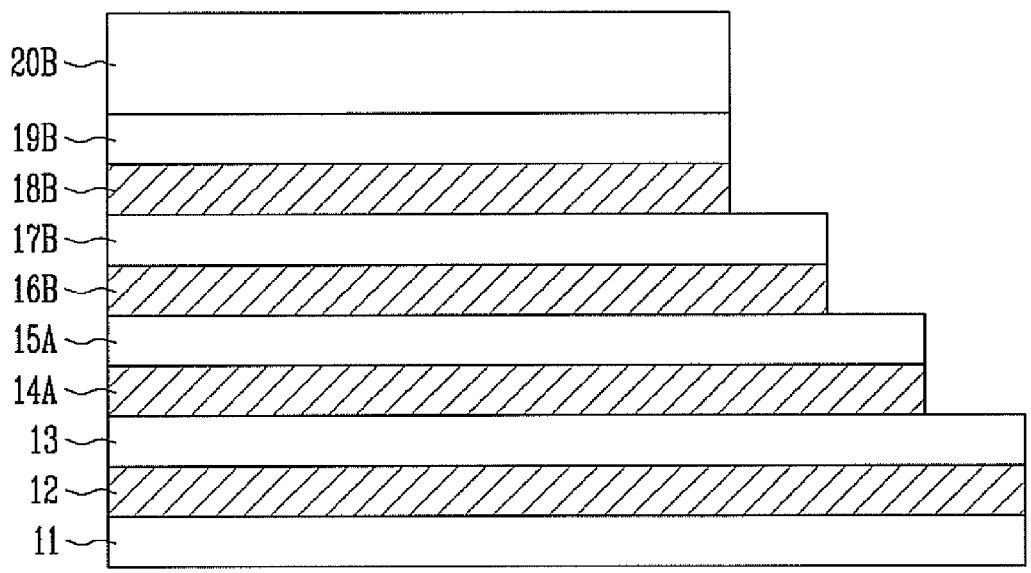
Figure 1D:
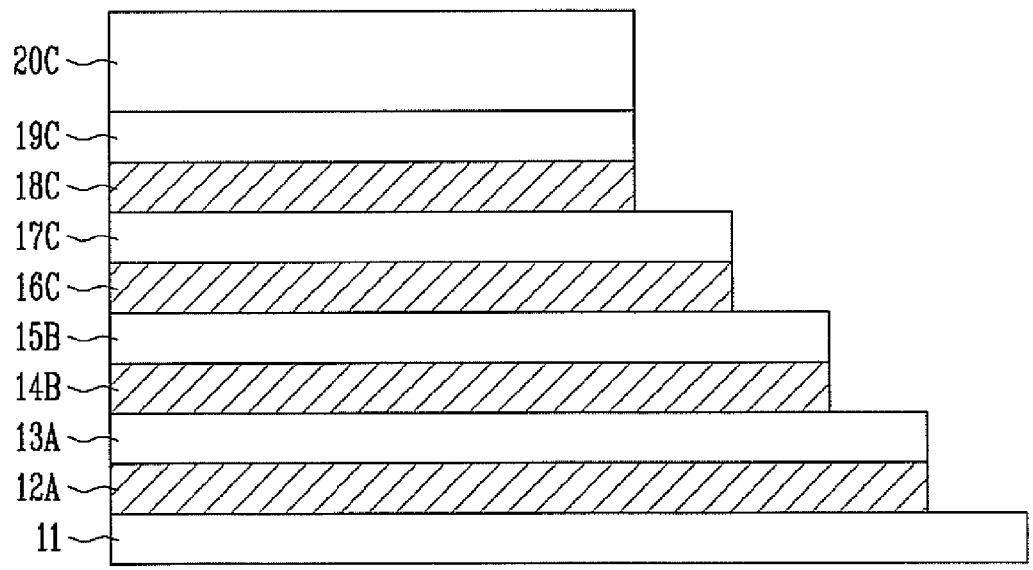
Figure 1E:
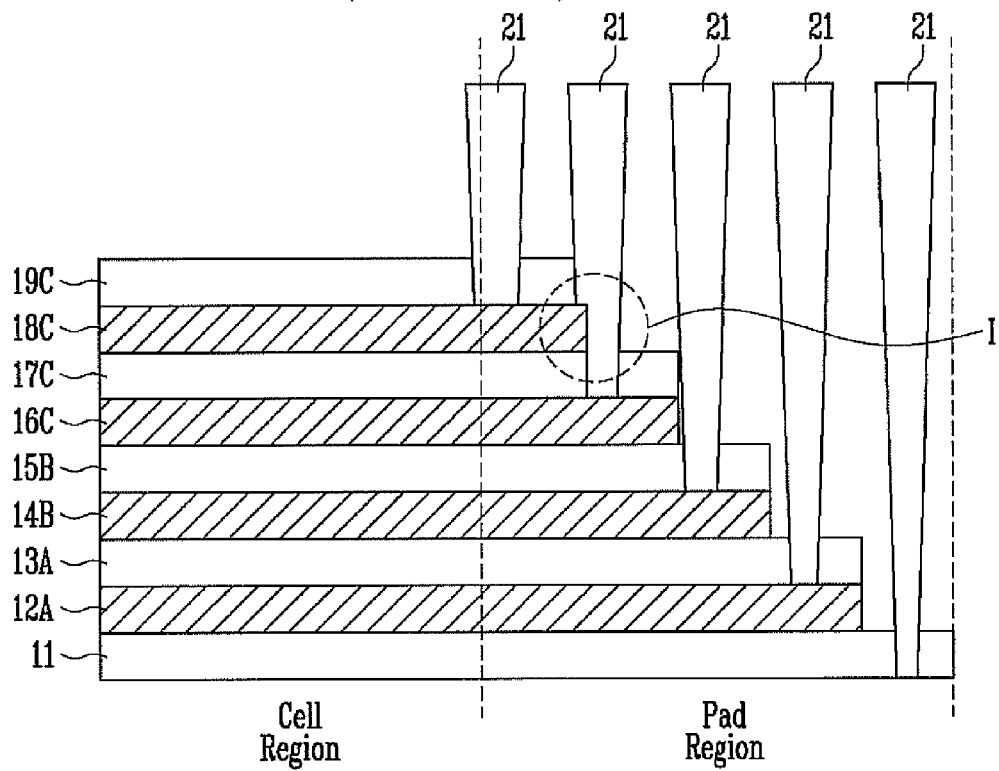
Figure 2A:
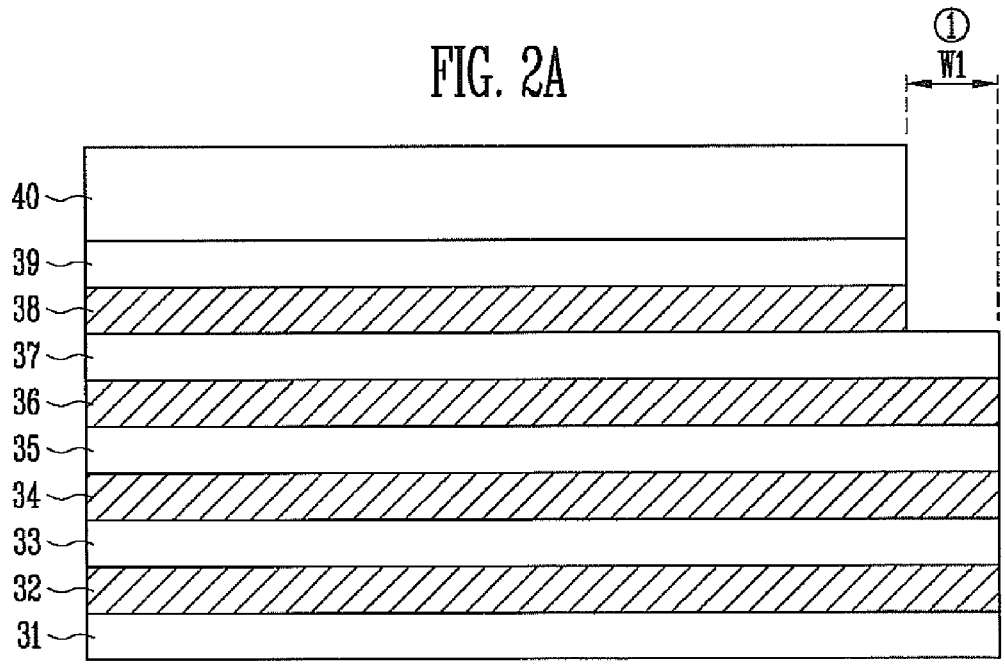
FIGS. 2A to 2E are cross-sectional views illustrating a process of manufacturing a non-volatile memory device having a 3-D structure according to a first embodiment of this disclosure.

As shown in FIG. 2A, a plurality of interlayer dielectric layers 31, 33, 35, 37, and 39 and a plurality of conductive layers 32, 34, 36, and 38 are alternately stacked over a substrate (not shown) in which underlying structures, such as a source line and a pipe gate, are formed.

The conductive layers 32, 34, 36, and 38 are used to form word lines, and they may be formed of a polysilicon layer, a tungsten layer, a metal layer, etc. Furthermore, while the conductive layers 32, 34, 36, and of four stacked layers are shown in FIG. 2A, the embodiment shown is exemplary only, and the number of layers of the stacked conductive layers 32, 34, 36, and 38 may be adjusted to correspond to the number of memory cells to be stacked. Furthermore, the interlayer dielectric layers 31, 33, 35, 37, and 39 are used to separate the word lines from each other, and they may be formed of an oxide layer.

Although not shown, the plurality of word lines stacked over the substrate may be formed using various methods. A process of forming the plurality of word lines and the plurality of memory cells stacked over the substrate is described as follows.

First, a plurality of first material layers and a plurality of second material layers are alternately formed over the substrate. The first material layers and the second material layers are made of materials having a great etch selectivity with respect to each other. For example, the first material layers may be formed of a conductive layer or a sacrificial layer for the word lines, and the second material layers may be formed of an interlayer dielectric layer or a sacrificial layer.

In a first embodiment (not shown), the first material layers may be made of a conductive layer, such as a polysilicon layer, and the second material layers may be formed of an interlayer dielectric layer, such as an oxide layer.

In a second embodiment (not shown), the first material layers may be formed of a doped polysilicon layer or a doped amorphous silicon layer for the word lines, and the second material layers may be formed of an undoped polysilicon layer or an amorphous silicon layer (that is, a sacrificial layer). Here, the term 'doped' means that a material/layer has been doped with a dopant, such as boron (Br), and the term 'undoped' means that a material/layer has not been doped with a dopant.

In a third embodiment (not shown), the first material layers may be formed of a sacrificial layer, such as a nitride layer, and the second material layers may be formed of an interlayer dielectric layer, such as an oxide layer.

Subsequently, the plurality of first material layers and the plurality of second material layers are etched to form trenches. A charge blocking layer, a memory layer, and a tunnel insulating layer are sequentially formed over the inner walls of the trenches. A layer for channels is formed on the tunnel insulating layer to form the channels extending from the substrate.

Subsequently, a slit is formed between the trenches by etching the plurality of first material layers and the plurality of second material layers.

In a first embodiment (not shown), the plurality of first material layers exposed by the slit is silicided to some thickness in order to reduce resistance of the word lines. For example, after a metal layer is formed in the slit, the plurality of first material layers may be silicided by causing the metal layer to react with the first material layers formed of the polysilicon layer through an annealing process. Subsequently, the metal layer remaining within the slit is removed, and an insulating layer is buried in the slit.

In a second embodiment (not shown), the plurality of second material layers exposed by the slit is recessed. Subsequently, an interlayer dielectric layer, such as an oxide layer, is buried in the regions in which the second material layers have been recessed, so that the stacked word lines are separated from each other.

In a third embodiment (not shown), the plurality of first material layers exposed by the slit is recessed. A conductive layer, such as a polysilicon layer, a tungsten layer, or a metal layer, is buried in the regions in which the first material layers have been recessed, thereby forming the word lines.

Accordingly, the plurality of memory cells and the plurality of word lines stacked over the substrate are formed. Here, the pair of channels extending from the substrate may be coupled to a pipe channel buried in the pipe gate. With the pipe channel connecting the pair of channels, the memory cells stacked along the pair of channels form one string.

Subsequently, a mask pattern 40 for forming pad regions is formed over the plurality of interlayer dielectric layers 31, 33, 35, 37, and 39 and the plurality of conductive layers 32, 34, 36, and 38.

The pad regions are regions where contact plugs are coupled to the respective word lines. Furthermore, the mask pattern 40 is used to form the pad regions for coupling the contact plugs to the respective word lines. The mask pattern 40 is used as an etch barrier in an etch process for patterning the plurality of word lines. In case of 3-D non-volatile memory device, the pad regions for coupling the contact plugs to the respective word lines are formed in each layer since the word lines are stacked in order to improve the degree of integration. Accordingly, the plurality of conductive layers 32, 34, 36, and 38 have a stepwise pattern to form the pad regions in the respective conductive layers 32, 34, 36, and 38. Here, the mask pattern 40 is used as an etch barrier. In other words, the plurality of conductive layers 32, 34, 36, and 38 have a stepwise pattern by repeatedly performing an etch process while removing the mask pattern 40 by appropriate length(s), thereby forming the pad regions in the respective conductive layers 32, 34, 36, and 38.

The width of the mask pattern 40 first formed is determined by the width that a first pad region ① of a first width W1, placed at the bottom, is to be exposed. Furthermore, the mask pattern 40 first formed has a sufficient thickness to act as an etch barrier despite its reduction in thickness due to repeated performance of an etch process. Here, the mask pattern 40 may be a photoresist pattern.

Subsequently, the interlayer dielectric layer 39, exposed by the mask pattern 40, and the conductive layer 38 under the interlayer dielectric layer 39 are primarily etched.

Figure 2B:
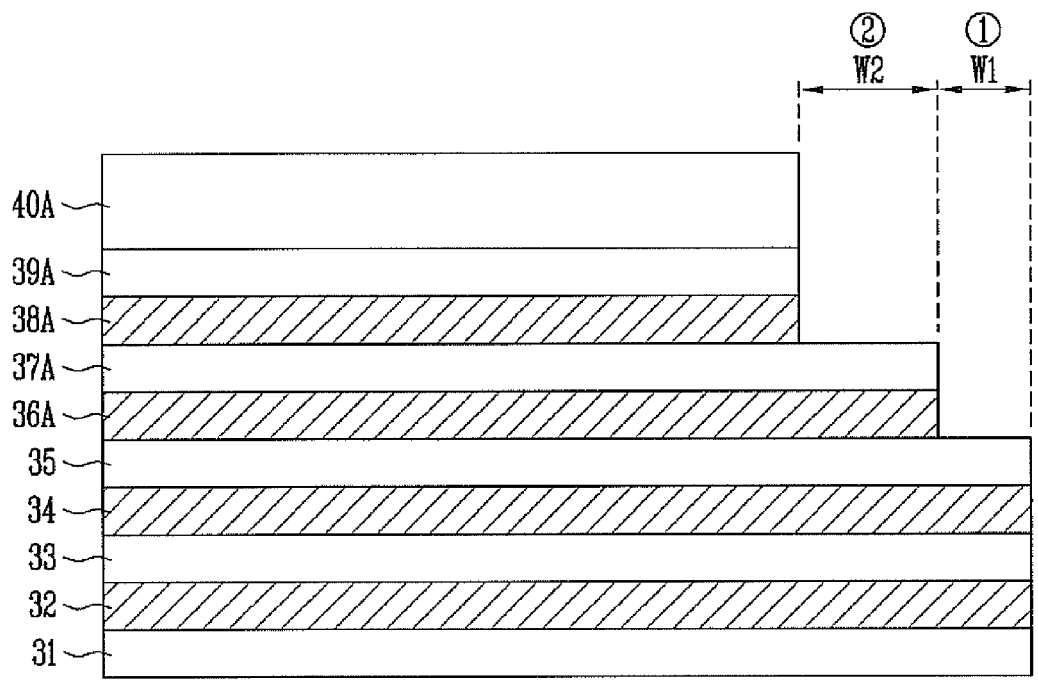

As shown in FIG. 2B, the mask pattern 40 is shortened by etching the mask pattern 40 by a width W2 of a second pad region ②. The width W2 of the second pad region ② determines the width of the mask pattern 40 to be removed so that it is greater than the width W1 of the first pad region ①. According to an example, a width of the mask pattern 40 is removed so that a difference between the width W1 of the first pad region ① and the width W2 of the second pad region ② is 5 to 30 nm.

Subsequently, a secondary etch process is performed by using the shortened mask pattern 40A as an etch barrier. Here, the interlayer dielectric layers 39 and 37 are exposed by the shortened mask pattern 40A, the exposed interlayer dielectric layers 39 and 37 are etched and the underlying conductive layers 38 and 36 are subsequently etched. In FIG. 2B, the etched interlayer dielectric layers are assigned reference characters 39A and 37A, and the etched conductive layers are assigned reference characters 38A and 36A.

Figure 2C:
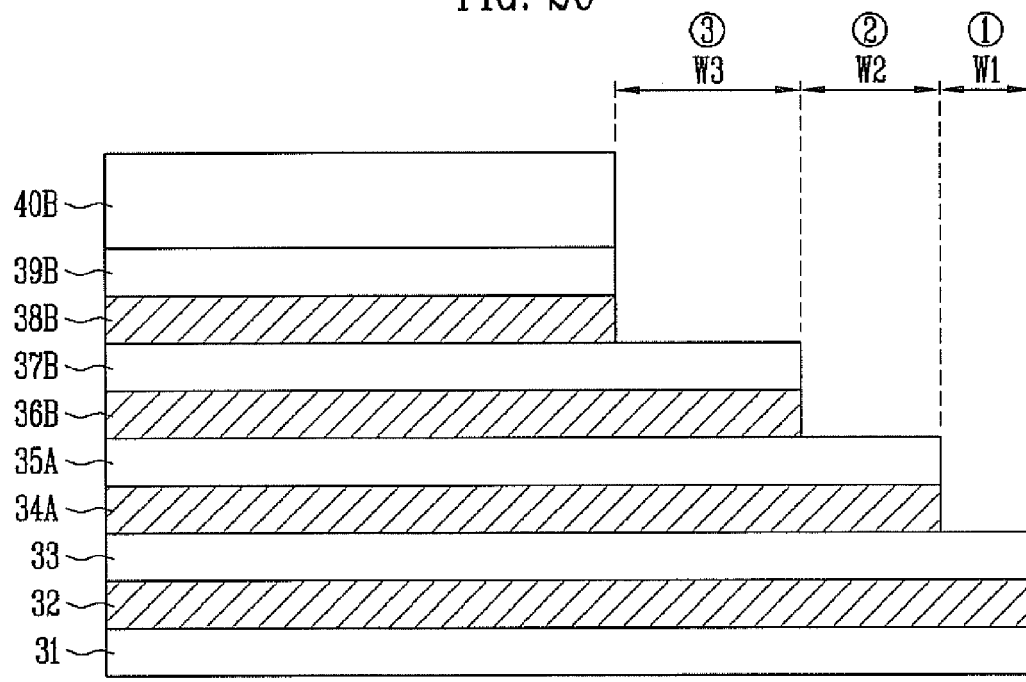

As shown in FIG. 2C, the mask pattern 40A is shortened by etching the mask pattern 40A by a width W3 of a third pad region ③. Here, the width by which the mask pattern 40A is shortened is controlled so that the width W3 of the third pad region ③ is greater than the width W2 of the second pad region ②. According to an example, the mask pattern 40A is shortened by a width so that a difference between the width W2 of the second pad region ② and the width W3 of the third pad region ③ is 5 to 30 nm.

Subsequently, the interlayer dielectric layers 39A, 37A, and 35, exposed by the shortened mask pattern 40B, and the underlying conductive layers 38A, 36A, and 34 are etched again. In FIG. 2C, the etched interlayer dielectric layers are assigned reference characters 39B, 37B, and 35A, and the etched conductive layers are assigned reference characters 38B, 36B, and 34A.

Figure 2D:
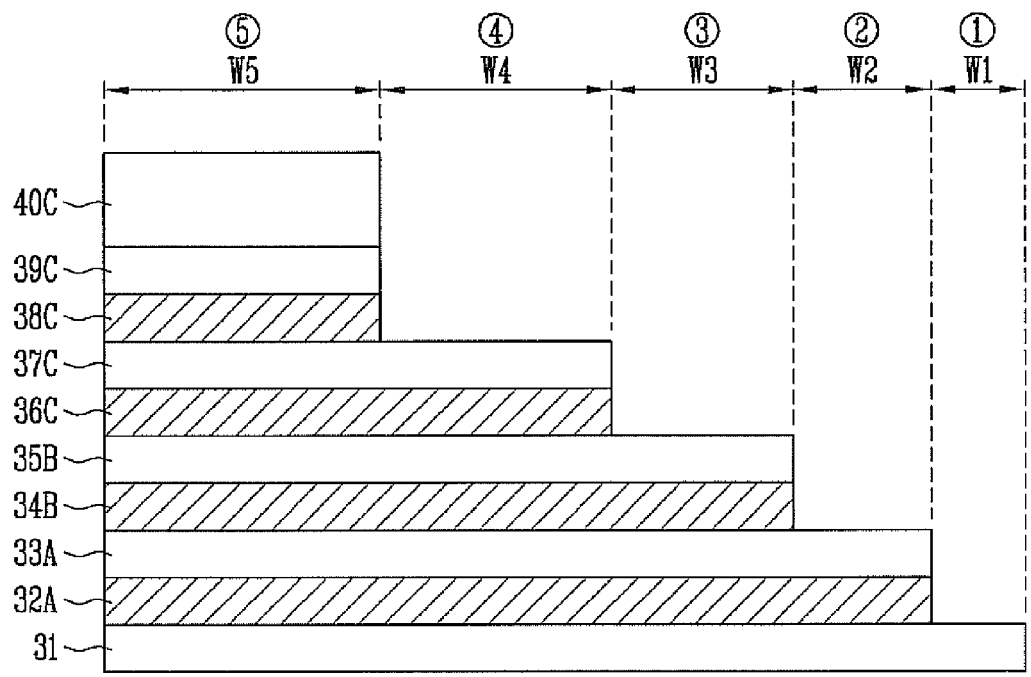

As shown in FIG. 2D, the mask pattern 40B is shortened by etching the mask pattern 40B by a width W4 of a fourth pad region ④. Here, a width by which the mask pattern 40B is shortened is controlled so that the width W4 of the fourth pad region ④ is greater than the width W3 of the third pad region ③. According to an example, the mask pattern 40A may be shortened so that a difference between the width W3 of the third pad region ③ and the width W4 of the fourth pad region ④ is 5 to 30 nm.

Subsequently, the interlayer dielectric layers 39B, 37B, 35A, and 33, exposed by the shortened mask pattern 40C, and the underlying conductive layers 38B, 36B, 34A, and 32 are etched again. In FIG. 2D, the etched interlayer dielectric layers are assigned reference numeral 39C, 37C, 35B, and 33A, and the etched conductive layers are assigned reference characters 38C, 36C, 34B, and 32A.

Accordingly, the plurality of conductive layers 38, 36, 34, and 32 stacked over the substrate are formed to have a stepwise pattern. Thus, the word lines 38C, 36C, 34B, and 32A, each having the pad region on one side, are formed, and the first to fifth pad regions ① to ⑤ are defined in the respective layers. Here, the second to fifth pad regions ② to ⑤ are the pad regions for the word lines, and the first pad region ① may be the pad region for the word line, the pad region for the source line or the pad region for the pipe gate.

Figure 2E:
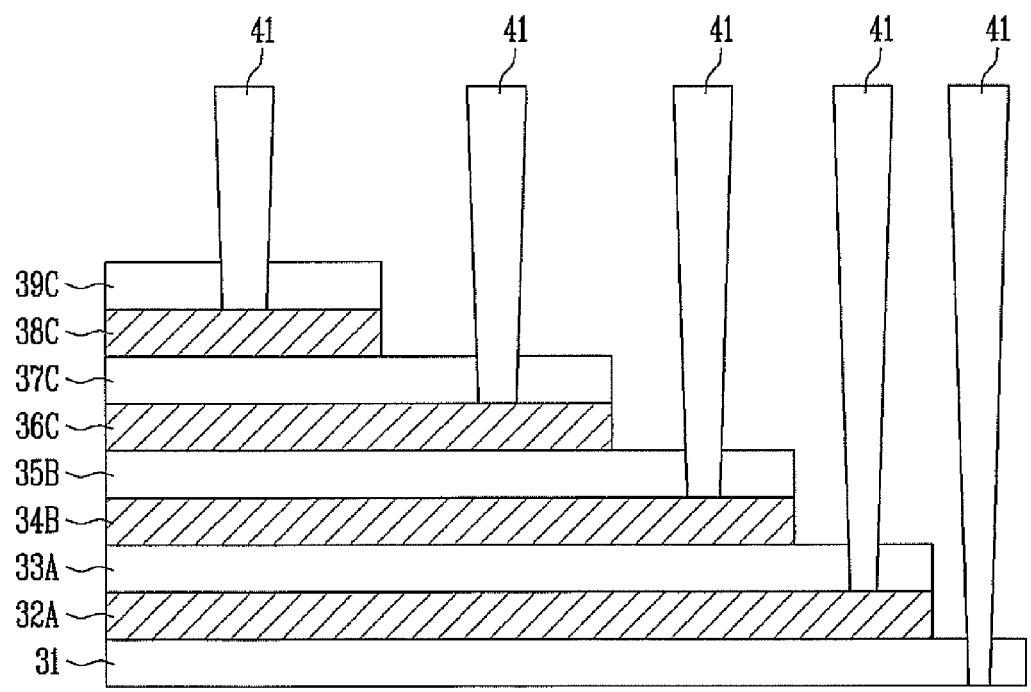

As shown in FIG. 2E, an insulating layer (not shown) is formed on the entire structure of the resulting structure in which the first to fifth pad regions ① to ⑤ are formed. Subsequently, contact holes through which the first to fifth pad regions ① to ⑤ of the conductive layers 38C, 36C, 34B, and 32A are exposed, respectively, are formed.

A conductive layer is buried in the contact holes to form a plurality of contact plugs 41 coupled to the respective conductive layers 38C, 36C, 34B, and 32A. Here, the conductive layer coupled to the contact plug 41 formed in the first pad region ① is not shown.

According to this disclosure, a pad region for an upper word line, from among the plurality of word lines included in the 3-D non-volatile memory device, has a greater width than a pad region for a lower word line.

A variety of embodiments in which a difference between the widths of the pad regions for two consecutive word lines remains the same (for example, for a same group of word lines) or varies are described below.

FIG. 2E is a diagram showing the pad regions according to the first embodiment of this disclosure. As shown, a difference between the width of a pad region for a word line and the width of a pad region for a lower word line is the same throughout the layers. In other words, the difference between the widths of pad regions for two consecutive word lines remains the same for all word lines.

For example, assuming that a difference between the widths of the first to fifth pad regions ① to ⑤ is constantly increased by 15 nm for each consecutive upper pad region, the first to fifth pad regions ① to ⑤ may have the widths of 15 nm, 30 nm, 45 nm, 60 nm, and 75 nm, respectively. To this end, the etch process is repeatedly performed by further shortening the mask pattern by the same width. In the second to fifth etch processes, the widths of the mask patterns are shortened to 30 nm, 45 nm, 60 nm, and 75 nm.

FIG. 3 is a diagram showing pad regions according to a second embodiment of this disclosure. As shown, a difference between the width of a pad region for a word line and the width of a pad region for each successive lower word line varies throughout the layers, where the difference increases for each successive upper word line. For example, assuming that an increment that each of the widths of the first to fifth pad regions ① to ⑤ is increased is further increased by 5 nm for each successive upper word line, the first to fifth pad regions ① to ⑤ may have respective widths of 10 nm, 15 nm, 25 nm, nm, and 60 nm. To this end, the etch process is repeatedly performed while decreasing the width of the mask pattern by 5 nm. For example, the second to fifth etch processes, the widths of the mask patterns may be decreased to 15 nm, 25 nm, 40 nm, and 60 nm.

FIG. 4 is a diagram showing pad regions according to a third embodiment of this disclosure. As shown, the widths of the pad regions are increased for every group, but the widths of pad regions in the same group are the same. In this case, a specific number of word lines may be grouped into one group, and the widths of pad regions in the groups may be increased for each successive upper group. Here, word lines belonging to each group have pad regions having the same width for the pad regions thereof, and an $(N+1)^{th}$ group includes pad regions, each group having a greater width of pad regions than that of a successive underlying $N^{th}$ group. Furthermore, widths of pad regions in each group are the same for all word lines of the group.

For example, assuming that word lines of four layers form one group, word lines of four layers belonging to a first group are included in respective pad regions ① having the same width W1, word lines of four layers belonging to a second group are included in respective pad regions ② having the same width W2, and word lines of four layers belonging to a third group are included in respective pad regions ③ having the same width W3. The pad region ③ of the third group has a greater width than the pad region ② of the second group, and the pad region ② of the second group has a greater width than the pad region ① of the first group. To this end, an etch process is repeatedly performed while decreasing the difference in widths of the pad regions between two successive word lines for each successive upper group. For example, when the etch process is performed for the first group, the width of the mask pattern may be decreased by 30 nm for each successive upper word line. When the etch process is performed for the second group, the width of the mask pattern may be decreased by 40 nm for each successive upper word line. When the etch process is performed for the third group, the width of the mask pattern may be decreased by 50 nm for each successive upper word line. In this case, a difference between the widths of pad regions in the first group and the second group and a difference between the widths of pad regions in the second group and the third group is 10 nm. Here, the width of the pad regions in a group increases by a constant change for each upper group.

Figure 5:
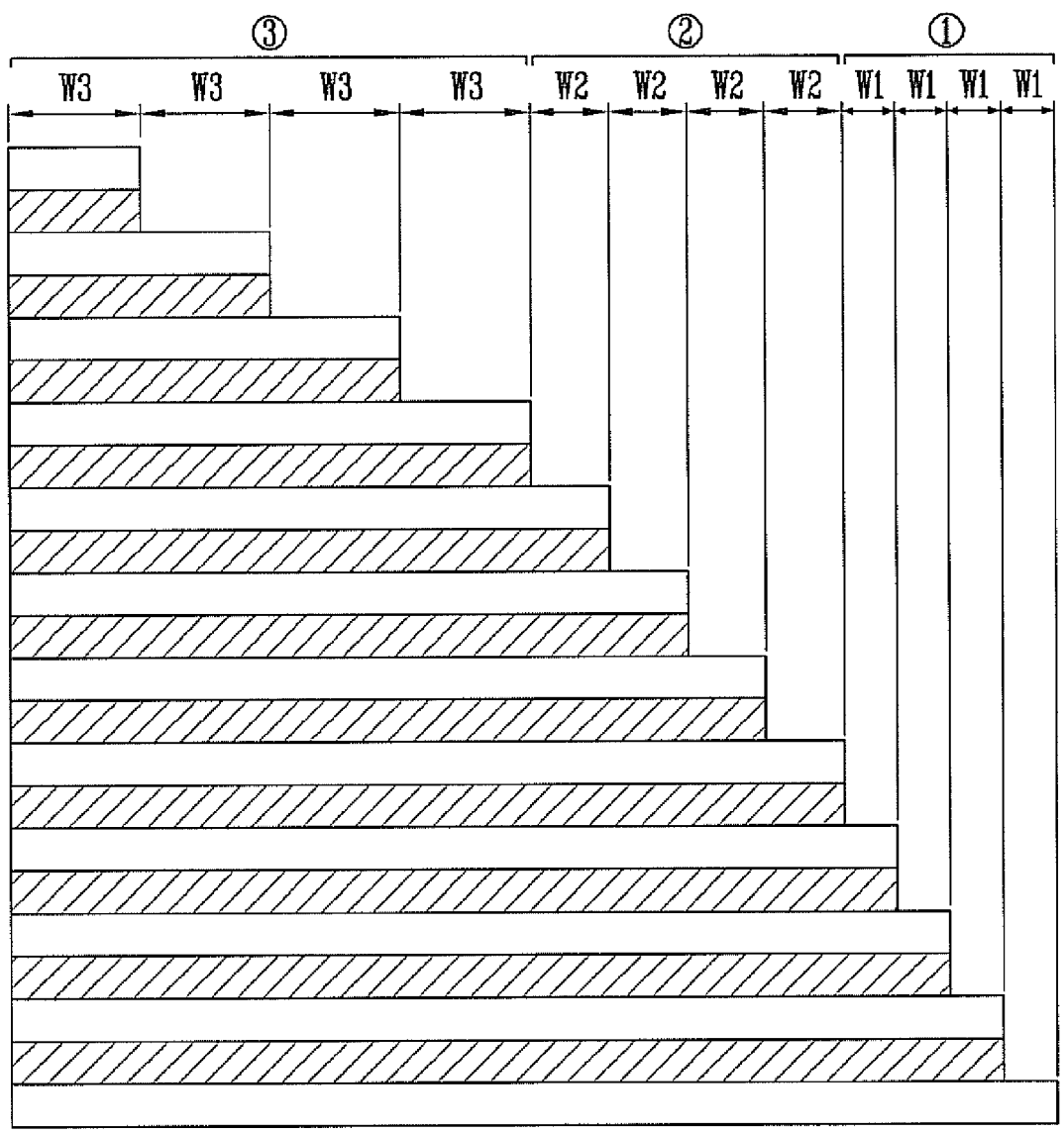
FIG. 5 is a diagram showing pad regions according to a fourth embodiment of this disclosure.

FIG. 5 is a diagram showing pad regions according to a fourth embodiment of this disclosure. As shown, the widths of the pad regions are increased for each upper group, but the magnitude of the increase becomes larger for each upper group. Thus, while a difference between the widths of pad regions for two consecutive groups is the same in the third embodiment, but it increases for each upper group in the fourth embodiment.

For example, assuming that a difference between the widths of pad regions increases by 5 nm for each successive upper group, the widths of pad regions ① to ③ belonging to respective groups are 30 nm, 35 nm, and 45 nm. For example, when the etch process is performed for the first group, the width of the pad regions may be 30 nm. When the etch process is performed for the second group, the width of the pad regions may be 35 nm. When the etch process is performed for the third group, the width of the pad regions may be 45 nm. In this case, a difference between the widths of the pad regions in the first group and the second group is 5 nm, whereas a difference between the widths of the pad regions in the second group and the third group 10 nm. In other words, the difference between two consecutive groups increases for each upper group.

According to this disclosure, even if errors are accumulated in the process of repeating the etch process, a probability that a pad region and a contact plug may be misaligned may decrease. In particular, the widths of the pad regions are not increased throughout while the width of an upper pad region, having a higher probability that a pad region and a contact plug may be misaligned, is increased. Accordingly, an alignment margin can be secured, and a cell area may be prevented from being excessively widened and a mask pattern may be prevented from being completely removed during an etch process.

Figure 6:
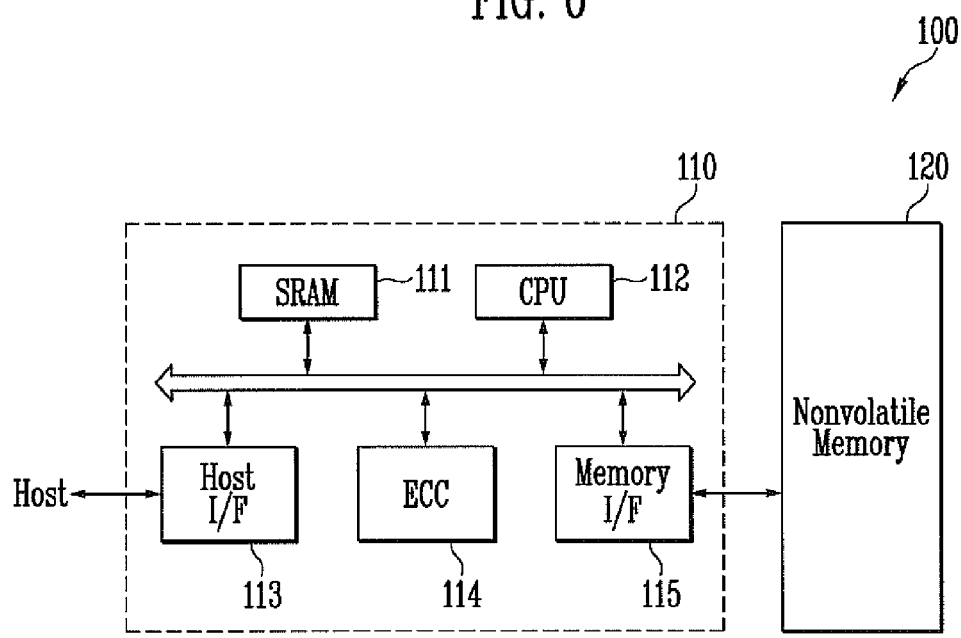
FIG. 6 shows the construction of a memory system according to a fifth embodiment of this disclosure.

FIG. 6 shows the construction of a memory system 100 according to a fifth embodiment of this disclosure.

As shown in FIG. 6, the memory system 100 according to the fifth embodiment of this disclosure includes a non-volatile memory device 120 and a memory controller 110.

The non-volatile memory device 120 is configured to have a cell array including the pad regions described above with reference to the first to fifth embodiments. Furthermore, the non-volatile memory device 120 may be a multi-chip package including a plurality of flash memory chips.

The memory controller 110 controls the non-volatile memory device 120. The memory controller 110 may include SRAM 111, a central processing unit (CPU) 112, a host interface (I/F) 113, an ECC (error correcting code) 114, and a memory interface (I/F) 115. The SRAM 111 is used as the operation memory of the CPU 112. The CPU 112 performs a general control operation for the data exchange of the memory controller 110. The host I/F 113 includes the data exchange protocol of a host which is coupled to the memory system 100. Furthermore, the ECC 114 detects and corrects an error included in data which is read from the non-volatile memory device 120. The memory I/F 115 performs an interface with the non-volatile memory device 120. The memory controller 110 may further include an RCM for storing code data for an interface with the host.

The memory system 100 constructed as described above may be a memory card or a solid state disk (SSD) in which the non-volatile memory device 120 and the controller 110 are combined. For example, if the memory system 100 is an SSD, the memory controller 110 may communicate with the outside (for example, a host) through one of various interface protocols, such as a USB, an MMC, PCI-E, SATA, PATA, SCSI, ESDI, and IDE.

Figure 7:
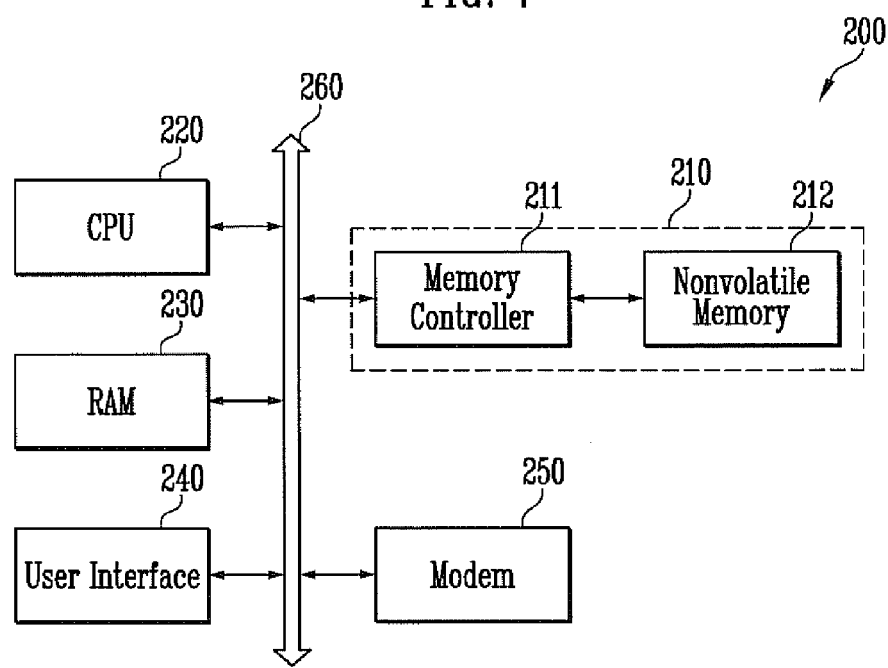
FIG. 7 shows the construction of a computing system according to a sixth embodiment of this disclosure.

FIG. 7 shows the construction of a computing system 200 according to a sixth embodiment of this disclosure.

As shown in FIG. 7, the computing system 200 according to the sixth embodiment of this disclosure may include a CPU 220, RAM 230, a user interface 240, a modem 250, and a memory system 210 which are electrically coupled to a system bus 260. Furthermore, if the computing system 200 is a mobile device, the computing system 200 may further include a battery for supplying operating voltage to the computing system 200. The computing system 200 may further include application chipsets, a camera image processor (CIS), a mobile DRAM and so on.

The memory system 210 may include a non-volatile memory device 212 and a memory controller 211 as described with reference to the fifth embodiment.

Meanwhile, the non-volatile memory device and the memory controller according to the embodiments of this disclosure may be mounted using various types of packages. For example, the non-volatile memory device and the memory controller may be mounted using packages, such as PoP (Package on Package), BGAs (Ball grid arrays), CSPs (Chip scale packages), PLCC (Plastic Leaded Chip Carrier), PDIP (Plastic Dual In-Kine Package), COB (Chip on Board), CERDIP (Ceramic Dual In-Line Package), MQFP (Plastic Metric Quad Flat Pack), TQFP (Thin Quad Flatpack), SOIC (Small Outline), SSOP (Shrink small Outline Package), TSOP (Thin Small Otline), TQFP (Thin Quad Flatpack), SIP (System In Package), MCP (Multi Chip Package), WFP (Wafer-Level Fabricated Package), and WSP (Wafer-Level Processed Stack Package).

According to this disclosure, the width of a pad region for a word line is greater than the width of a pad region for a lower word line. Accordingly, although errors are accumulated in a process of repeating an etch process, a probability that a pad region and a contact plug may be misaligned is decreased. In particular, while the widths of the pad regions are not globally increased, the width of an upper pad region, having a higher probability that a pad region and a contact plug may be misaligned, is increased. Accordingly, an alignment margin may be secured, and a cell area may be prevented from being excessively widened, while a mask pattern is prevented from being completely removed during the etch process.

What is claimed is:

1. A non-volatile memory device, comprising:
a plurality of word lines stacked and having a stepwise pattern, wherein the plurality of word lines each have a pad region; and
a plurality of contact plugs coupled to the respective pad regions of the word lines,
wherein a width of a pad region of a first one of the plurality of word lines is greater than a width of a pad region of a second word line lower than the first word line,
wherein the plurality of word lines form separate groups of word lines and the widths of the pad regions for each group of the groups of word lines increase for each successive upper group of the groups of word lines.

2. A non-volatile memory device, comprising:
a plurality of word lines stacked and having a stepwise pattern, wherein the plurality of word lines each have a pad region; and
a plurality of contact plugs coupled to the respective pad regions of the word lines,
wherein a width of a pad region of a first one of the plurality of word lines is greater than a width of a pad region of a second word line lower than the first word line,
wherein
the plurality of word lines form separate groups of word lines,
widths of the pad regions of the plurality of word lines are increased by a same amount for each successive upper group of the groups of word lines, and
word lines belonging to each group of the groups of word lines have a same width for the respective pad regions.

3. A non-volatile memory device, comprising:
a plurality of word lines stacked and having a stepwise pattern, wherein the plurality of word lines each have a pad region; and
a plurality of contact plugs coupled to the respective pad regions of the word lines,
wherein a width of a pad region of a first one of the plurality of word lines is greater than a width of a pad region of a second word line lower than the first word line,
wherein
the plurality of word lines form separate groups of word lines,
widths of pad regions of the plurality of word lines are increased by a progressively larger amount for each successive upper group of the groups of word lines, and
word lines belonging to one group of the groups of word lines have a same width for the respective pad regions.

4. A non-volatile memory device, comprising:
a plurality of word lines stacked and having a stepwise pattern, wherein the plurality of word lines each have a pad region; and
a plurality of contact plugs coupled to the respective pad regions of the word lines,
wherein a width of a pad region of a first one of the plurality of word lines is greater than a width of a pad region of a second word line lower than the first word line,
wherein the plurality of word lines form separate groups of word lines and an increase in the widths of the pad regions for two successive ones of the groups of word lines ranges between 5 nm and 30 nm.

5. A non-volatile memory device, comprising:
a first word line having a first pad portion;
a second word line having a second pad portion and covering the first word line except the first pad portion, wherein the second pad portion has a greater width than the first pad portion;
a third word line having a third pad portion and covering the second word line except the second pad portion, wherein the third pad portion has a greater width than the second pad portion;
a fourth word line having a fourth pad portion and covering the third word line except the third pad portion, wherein the fourth pad portion has a greater width than the third pad portion; and
first to fourth contact plugs coupled to the first to fourth pad portions, respectively.

6. The non-volatile memory device of claim 5, wherein a first width difference between the first pad portion and the second pad portion, a second width difference between the second pad portion and the third pad portion, and a third width difference between the third pad portion and the fourth pad portion are the same as each other.

7. The non-volatile memory device of claim 5, wherein a first width difference between the first pad portion and the second pad portion is smaller than a second width difference between the second pad portion and the third pad portion, and the second width difference is smaller than a third width difference between the third pad portion and the fourth pad portion.

8. A non-volatile memory device, comprising:
a first word line group including first word lines having first pad portions of the same width;
a second word line group including second word lines having second pad portions of the same width and covering the first word line group except the first pad portions, wherein the second pad portions have a greater width than the first pad portions;
a third word line group including third word lines having third pad portions of the same width and covering the second word line group except the second pad portions, wherein the third pad portions have a greater width than the second pad portions;
a fourth word line group including fourth word lines having fourth pad portions of the same width and covering the third word line group except the third pad portions, wherein the fourth pad portions have a greater width than the third pad portions; and
first to fourth contact plugs coupled to the first to fourth pad portions, respectively.

9. The non-volatile memory device of claim 8, wherein a first width difference between the first pad portions and the second pad portions, a second width difference between the second pad portions and the third pad portions, and a third width difference between the third pad portions and the fourth pad portions are the same as each other.

10. The non-volatile memory device of claim 8, wherein a first width difference between the first pad portions and the second pad portions is smaller than a second width difference between the second pad portions and the third pad portions, and the second width difference is smaller than a third width difference between the third pad portions and the fourth pad portions.

* * * * *